United States Patent [19]
Inoue et al.

[11] Patent Number: 5,136,351
[45] Date of Patent: Aug. 4, 1992

[54] PHOTOVOLTAIC DEVICE WITH POROUS METAL LAYER

[75] Inventors: Yasumi Inoue, Osaka; Yukihiko Nakata, Nara; Manabu Itoh, Nara; Akitoshi Yokota, Nara; Hitoshi Sannomiya, Osaka; Sota Moriuchi, Nara, all of Japan

[73] Assignee: Sharp Kabushiki Kaisha, Osaka, Japan

[21] Appl. No.: 677,242

[22] Filed: Mar. 29, 1991

[30] Foreign Application Priority Data

Mar. 30, 1990 [JP] Japan ................................. 2-87057
Aug. 28, 1990 [JP] Japan ................................ 2-226926

[51] Int. Cl.$^5$ ............................................ H01L 27/14
[52] U.S. Cl. ........................................ 357/30; 357/2;
357/68; 357/58; 357/71; 136/256; 136/255; 136/258; 136/261
[58] Field of Search .................. 357/30 J, 30 K, 30 L, 357/71, 2, 58, 68; 136/256, 255, 258, 261

[56] References Cited
U.S. PATENT DOCUMENTS

| | | | |
|---|---|---|---|
| 4,259,122 | 3/1981 | Purwin et al. | 357/30 J X |
| 4,599,482 | 7/1986 | Yamazaki | 357/30 K X |
| 4,694,116 | 9/1987 | Hayashi et al. | 357/30 J X |
| 4,703,337 | 10/1987 | Yamazaki | 357/30 K |
| 4,818,337 | 4/1989 | Barnett et al. | 136/256 X |
| 4,900,370 | 2/1990 | Itoga et al. | 357/30 J X |

Primary Examiner—William Mintel

[57] ABSTRACT

A photovoltaic device includes a semi-continuous metal layer having an uneven surface, which is not uniform, formed on a substrate, a reflective continuous metal layer having a substantially uniform thickness formed to cover the semi-continuous metal layer, a semiconductor film for photoelectric conversion formed on the reflective continuous metal layer, and a transparent electrode formed on the semiconductor film.

15 Claims, 13 Drawing Sheets

PHOTOVOLTAIC DEVICE WITH POROUS METAL LAYER

BACKGROUND OF THE INVENTION

1. Field of the Invention

The present invention relates to photovoltaic devices, and more particularly, to improving the photoelectric conversion efficiency of a photovoltaic device including a thin film of an amorphous semiconductor.

2. Description of the Background Art

Reduction in cost and improvement in photoelectric conversion efficiency are desired characteristics for photovoltaic devices. A photovoltaic device including an amorphous semiconductor film can be formed in a thin configuration because light absorption thereof is higher than that of a photovoltaic device including a crystalline semiconductor layer. The amorphous photovoltaic device has an advantage that the manufacturing process is simple. There is also an advantage that energy can be saved at the time of manufacturing due to a low temperature process. The amorphous photovoltaic device can use economic glass, stainless steel, ceramic or the like for the substrate material to reduce the cost.

However, when glass, stainless steel, ceramic, etc. are used as the substrate material, the light reflectance of the surface of these materials is generally low. Therefore, the reflectance of the substrate surface is increased by forming a smooth reflecting layer on the substrate using one or more kinds of metal having high reflectance to improve the photoelectric conversion efficiency. A method is taken to improve the photoelectric conversion efficiency by reflecting the incident light at the substrate surface not absorbed by the semiconductor film of the photovoltaic device and making this reflected light be absorbed by the semiconductor film.

However, interference occurs between the incident light and the reflected light to produce interference fringes when light passing the semiconductor film is mirror-reflected from the substrate surface and is again introduced into the semiconductor film. Interference fringe is a phenomenon where light waves weaken or strengthen each other. This means that the intensity of the incident light and the reflected light interact each other to be weakened, depending on the thickness of the semiconductor film and the wavelength of the incident light. This is relatively equivalent to a reduction in the luminance energy, which results in a reduction of the photoelectric conversion efficiency.

Referring to FIG. 15, a schematic sectional view of a known photovoltaic device is shown that is expected to improve photoelectric conversion efficiency by reducing the above-mentioned light interference. This photovoltaic device is provided with a reflective metal layer 2 having an uneven surface on a substrate 1. The reflective metal layer 2 serves as a back electrode. An amorphous semiconductor film 3 serving as a photoelectric conversion layer is formed on the back electrode 2. The semiconductor film 3 is covered by a transparent front electrode 4.

An incident light beam $L_0$ into such a photovoltaic device that is not absorbed within the semiconductor film 3 reaches the back metal electrode 2, whereby the incident light beam $L_0$ is scatter-reflected on the uneven surface of the back metal electrode 2. If the scatter-reflected light $L_1$ is not absorbed within the semiconductor film 3 and returns to the interface of the semiconductor film 3 and the transparent front electrode 4, light $L_1$ is likely to become a light $L_2$ reflected again at the interference back into the semiconductor film 3, due to the tendency of $L_1$ establishing a relatively large angle with respect to the normal line of the aforementioned interface. In other words, incident light once entering the semiconductor film 3 is apt to be confined within the semiconductor film 3. This is called "light confinement technology".

As a result, interference between light reflected from the back metal electrode 2 and the incident light is reduced in the photovoltaic device of FIG. 15. The scatter-reflected light from the back metal electrode 2 is efficiently absorbed within the semiconductor film 3 because the optical path length of the reflected light becomes longer and contributes to photoelectric conversion.

One method of forming a back metal electrode having an uneven surface includes the steps of depositing a silver film having a thickness of approximately 1000Å at approximately 260° C. on a substrate by electron beam evaporation, and baking in vacuum the same for obtaining an uneven surface of the silver film. Another conventional method includes the steps of depositing a silver film of approximately 1000Å in thickness at approximately 200° C. on a substrate, and baking the same at approximately 600° C. for obtaining an uneven surface of the silver film.

It is however difficult to form a satisfactory uneven surface on the back metal electrode suitable for "light confinement" using the method of baking. Furthermore, such baking at a high temperature of 600° C. may exert a bad influence on the substrate.

SUMMARY OF THE INVENTION

In view of the foregoing, an object of the present invention is to provide a photovoltaic device comprising a back metal electrode that can sufficiently scatter-reflect incident light, and a method of manufacturing the same.

Another object of the present invention is to provide a photovoltaic device with improved photoelectric conversion efficiency, and a method of manufacturing the same.

According to a first aspect of the present invention, a photovoltaic device includes a substrate, a semi-continuous metal layer having an uneven surface, which is not uniform, formed on the substrate, a reflective continuous metal layer, which is substantially uniform in thickness, formed to cover the semi-continuous metal layer, a semiconductor film formed on the continuous metal layer, and a transparent electrode formed on the semiconductor film.

In the photovoltaic device according to the first aspect of the present invention, the semi-continuous metal layer has an uneven surface, which is not uniform, and the reflective continuous metal layer, which is substantially uniform in thickness, whereby the surface of the continuous metal layer succeeds the unevenness of the surface of the semi-continuous metal layer. Therefore, the incident light through the semiconductor film is scatter-reflected by the uneven surface of the continuous metal layer to be confined in the semiconductor film effectively. Not only the incident light but also the reflected light are efficiently utilized for photoelectric conversion in the semiconductor film to improve the photoelectric conversion efficiency of the photovoltaic device.

According to a second aspect of the present invention, a method of manufacturing a photovoltaic device comprises the steps of forming a semi-continuous metal layer having a nonuniform uneven surface on a substrate at a relatively high temperature; depositing a reflective continuous metal layer having substantially a nonuniform thickness at a relatively low temperature to cover the semi-continuous metal layer; depositing a semiconductor film for photoelectric conversion to cover the continuous metal layer; and depositing a transparent electrode on the semiconductor film.

In the method of forming a photovoltaic device of the second aspect of the present invention, the semi-continuous metal layer can have a nonuniform and satisfactory uneven surface because the semi-continuous metal layer is deposited on the substrate at a relatively high temperature. The reflective continuous metal layer is deposited on the semi-continuous metal layer at a relatively low temperature, so that the continuous metal layer has a uniform thickness and the surface thereof succeeds the unevenness of the surface of the semi-continuous metal layer.

According to a third embodiment of the present invention, a photovoltaic device includes a substrate, a continuous metal film having a reflective surface formed on the substrate, a transparent conductive layer formed to cover the continuous metal film, and an island-like reflective metal layer formed on the transparent conductive layer, a semiconductor film for photoelectric conversion formed to cover the island-like metal layer, and a transparent electrode formed on the semiconductor film.

In the photovoltaic device of the third embodiment of the present invention, the incident light transmitted through the semiconductor film is scatter-reflected by the island-like metal layer, whereby the incident light passing the opening of the island-like metal layer is reflected by the continuous metal film back towards the semiconductor film. Therefore, the incident light and the reflected light are used effectively for photoelectric conversion within the semiconductor film to improve the photoelectric conversion efficiency of the photovoltaic device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
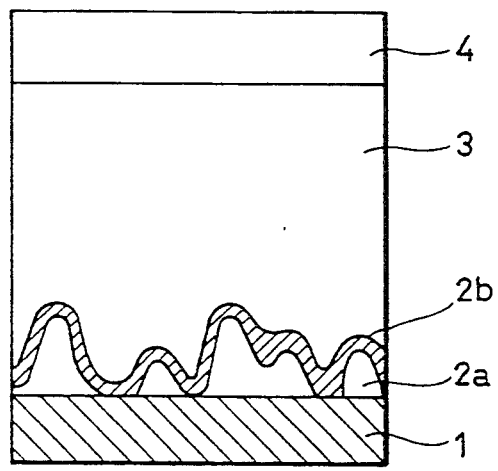
FIG. 1 is a sectional view schematically showing a photovoltaic device according to a first embodiment of the present invention.

FIG. 1 shows a sectional view of a photovoltaic device according to a first embodiment of the present invention. In the photovoltaic device, a first semi-continuous porous metal layer $2a$ having an uneven surface is formed on a substrate 1 such as of glass, stainless steel, or ceramic. The semi-continuous metal layer $2a$ having an uneven surface is covered by a reflective continuous second metal layer $2b$ having a substantially uniform thickness. The first and second metal layers $2a$ and $2b$ serve as a back electrode. An amorphous semiconductor thin film 3, such as Si, SiGe, or CdS, for photoelectric conversion is formed on the continuous second metal layer $2b$. A transparent front electrode 4 is formed on the thin film semiconductor 3.

A photovoltaic device of FIG. 1 can be formed by the following steps. A plate of stainless steel SUS 304 having a polished surface may be used as the substrate 1. The semi-continuous first metal layer $2a$ and the continuous second metal layer $2b$ may be formed using silver having high reflectance.

The semi-continuous first silver layer $2a$ having an uneven surface can be formed by being deposited by electron beam evaporation or sputtering at a growth rate of approximately 10Å/second to a thickness within the range of 250Å–800Å on substrate 1 maintained at a not less than 300° C. A semi-continuous first silver layer $2a$ having a satisfactory uneven surface cannot be obtained if the temperature of the substrate is less than 300° C. Although a high temperature of the substrate is preferred for promoting local aggregation to obtain a satisfactory uneven surface, a temperature too high exerts a bad influence on the substrate 1. The more preferred range of temperature for the substrate to form a semi-continuous first silver layer $2a$ having a satisfactory uneven surface is within the range of 300°–450° C. A satisfactory uneven surface by aggregation cannot be obtained for the first metal layer $2a$ if the first silver layer $2a$ is thinner than 250Å or thicker than 800Å. The more preferable thickness of the first silver layer $2a$ for obtaining a satisfactory uneven surface of the first silver layer 2a is within the range of 250–600Å.

A continuous second silver layer 2b having a substantially uniform thickness can be formed by being deposited by electron beam evaporation or sputtering at a growth rate of approximately 10Å/second to a thickness of not less than 300Å to cover the semi-continuous first silver layer 2a at a substrate temperature of less than 260° C. Because the continuous second silver layer 2b has a substantially uniform thickness, the upper surface of the continuous second silver layer 2b also has an uneven surface similar to the uneven surface of the semicontinuous first silver layer 2a. A completely continuous film of the second silver layer 2b cannot be obtained if the second silver layer 2b is thinner than 300Å. On the contrary, if the second silver layer 2b is thicker than 700Å, the unevenness of the surface is liable to become unsatisfactory. The most preferable thickness of the second silver layer 2b is within the range of 350–500Å. A low temperature is preferable for the substrate in order to form a continuous second silver layer 2b that is thin as possible and without aggregation. However, if the substrate temperature is too low, the adhesiveness between the semi-continuous first silver layer 2a and the continuous second silver layer 2d is reduced. The preferable substrate temperature for the second silver layer 2b formation is within the range of 100°–260° C.

Figure 2:
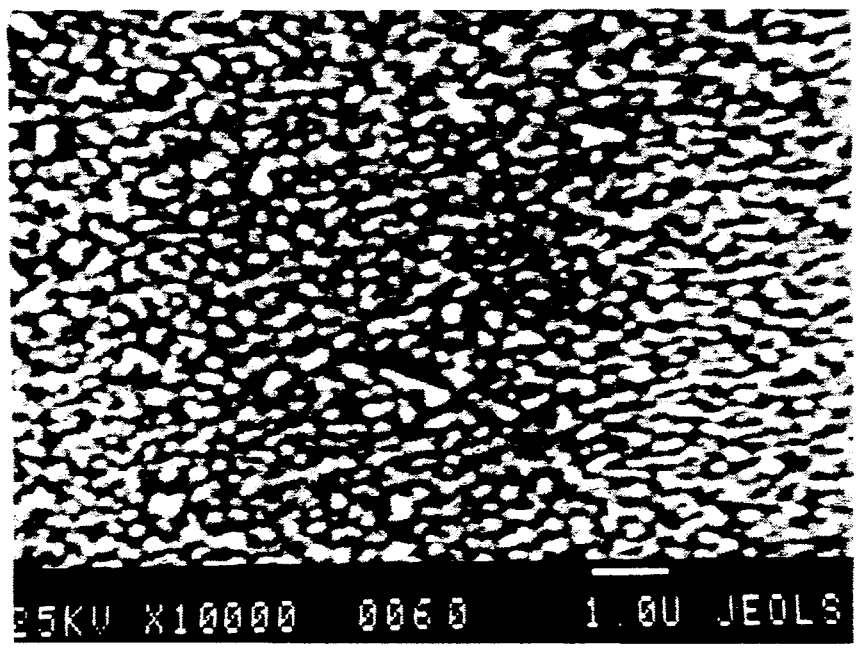
FIG. 2 is a SEM micrograph of the metal structure of an silver layer deposited to a thickness of 200Å on a stainless substrate at 350° C.

Referring to FIG. 2, an SEM (Scanning Electron Microscope) micrograph is shown of the semi-continuous first silver layer 2a deposited to a thickness of 200Å on stainless steel substrate 1 at 350° C. This SEM micrograph is taken from a direction at an angle of 45° from the surface of the substrate 1. The semi-continuous silver layer 2a includes the locally aggregated white island-like or semi-island-like areas, and covers approximately 50% of the surface of the substrate. The white short horizontal bar at the bottom of the micrograph indicates the length of 1.0μm.

Figure 3A:
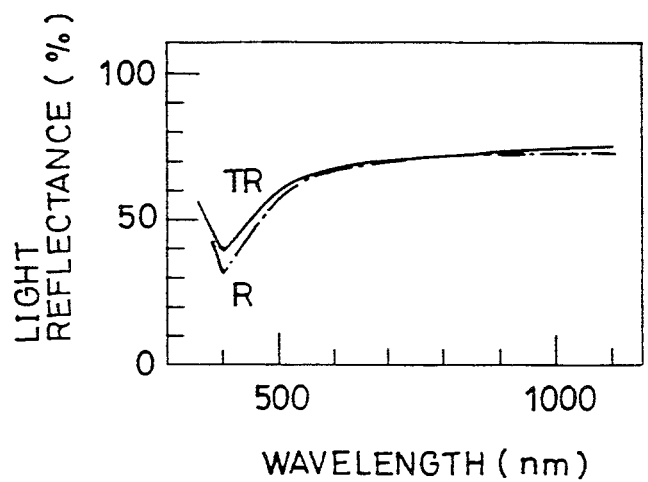
FIGS. 3A and 3B are graphs showing the light reflecting characteristics of the substrate of FIG. 2.
Figure 3B:
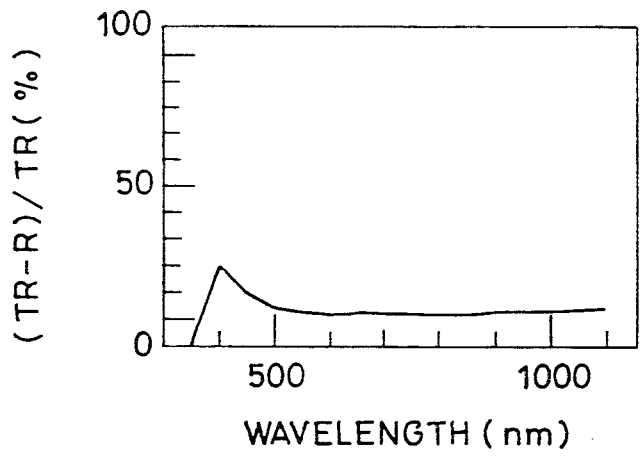

Referring to the graph of FIG. 3A, light reflectance of a stainless steel substrate 1 including a semi-continuous first silver layer 2a of 200Å thickness is shown. The abscissa indicates the wavelength (nm) of the incident light, and the ordinate indicates the light reflectance (%). The chain dotted line curve R represents mirror reflection (reflection where the incident angle and the reflected angle of light towards the substrate surface is equal). The solid line curve TR represents total reflection (including not only mirror reflection but also scatter-reflection). Referring to the graph of FIG. 3B, the abscissa indicates the wavelength (nm) of the incident light, and the ordinate indicates the ratio of the scatter-reflection to total reflection (TR−R)/TR(%). It can be understood from the graphs of FIGS. 3A and 3B that the total reflection TR and the scatter-reflection (TR−R)/TR are both insufficient for the substrate surface of FIG. 2.

Figure 4:
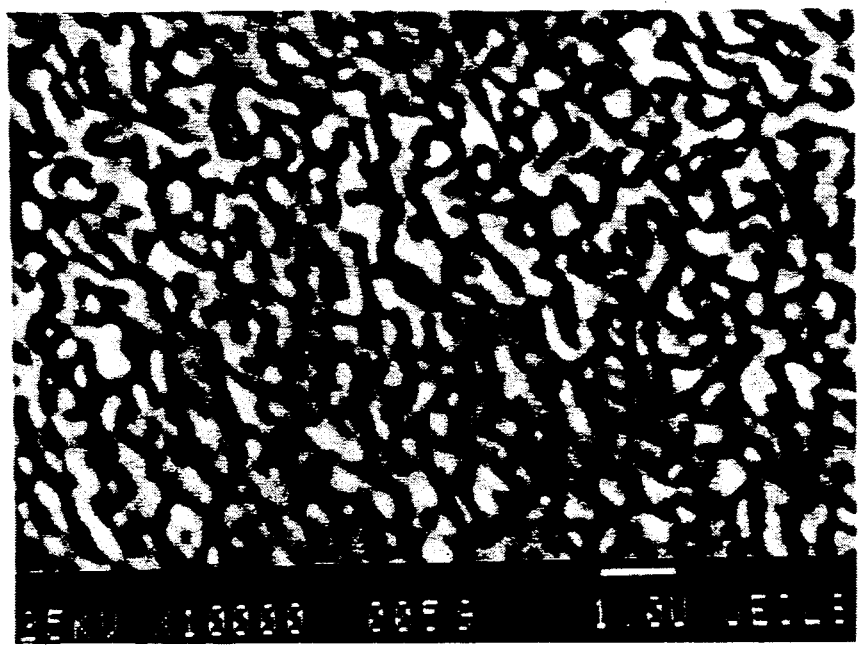
FIG. 4 is an SEM micrograph showing the metal structure of a semi-continuous silver layer deposited to a thickness of 500Å on a stainless steel substrate at 350° C.

Referring to FIG. 4, an SEM micrograph shows a semicontinuous first silver layer 2a deposited to a thickness of 500Å on stainless steel substrate 1 at 350° C. Local aggregation is seen in the first silver layer 2a of FIG. 4, with a structure coarser than that of FIG. 2.

Figure 5A:
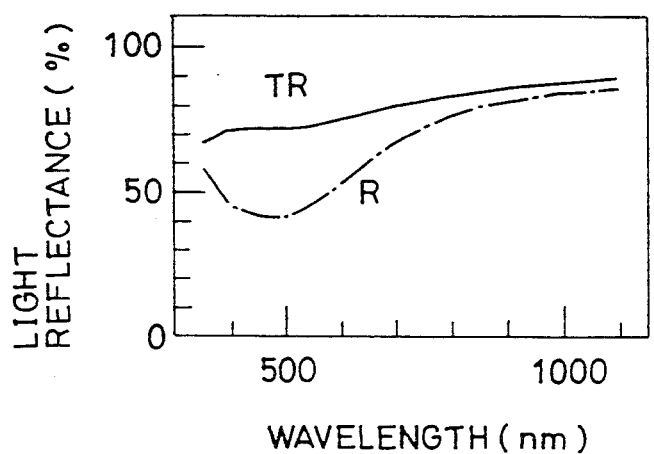
FIGS. 5A and 5B are graphs showing the light reflecting characteristics of the substrate of FIG. 4.

The graph of FIG. 5A shows light reflectance of the substrate of FIG. 4 including a semi-continuous first silver layer 2a of 500Å thickness. It can be appreciated from FIG. 5A that the total reflection TR is higher than that of FIG. 3A. It can be understood from FIG. 5B that this increase in the total reflection TR is due to increase in the scatter-reflection (TR−R)/TR.

Figure 6:
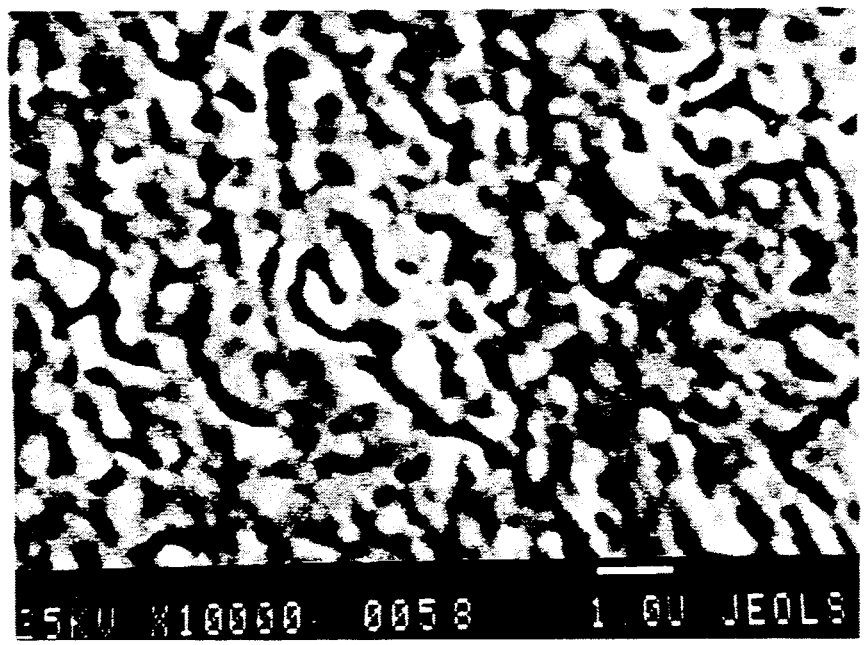
FIG. 6 is an SEM micrograph showing the metal structure of a continuous silver layer deposited to a thickness of 1000Å on a stainless steel substrate at 350° C.

Referring to FIG. 6, an SEM micrograph of a silver layer deposited to a thickness of 1000Å on a stainless steel substrate 1 at 350° C. is shown. Although the silver layer of FIG. 6 has an uneven surface, this layer is substantially continuous. That is to say, this silver layer completely covers the surface of the stainless steel substrate.

Figure 7A:
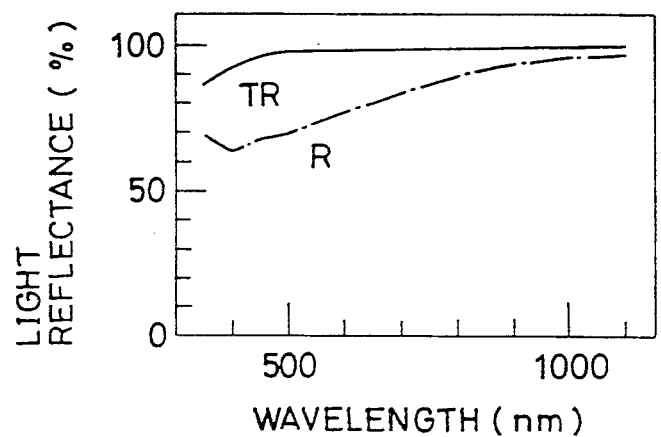
FIGS. 7A and 7B are graphs showing the light reflecting characteristics of the substrate of FIG. 6.
Figure 7B:
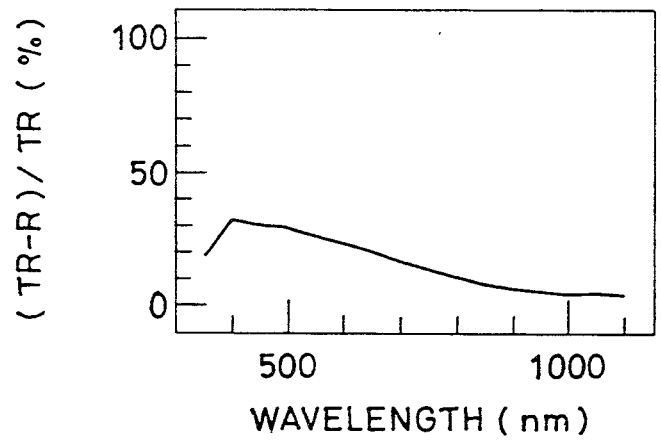

The graph of FIG. 7A indicates the light reflectance of the substrate of FIG. 6 including a silver layer of 1000Å thickness. Although the total reflection TR of FIG. 7A is higher than that of FIG. 5A, it can be understood from comparing FIGS. 7B and 5B that the scatter-reflection (TR−R)/TR is decreased.

Figure 5B:
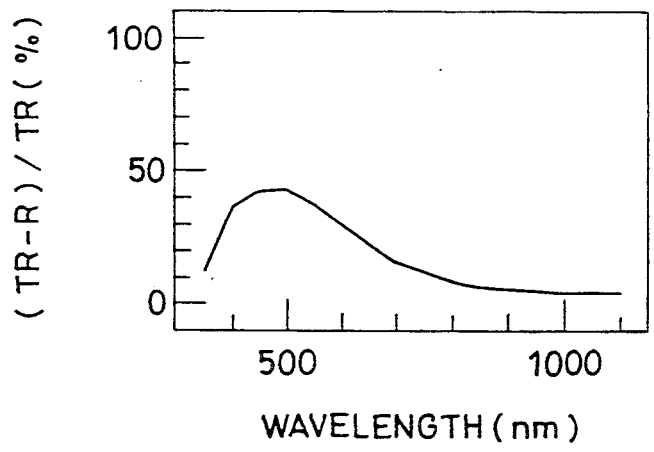

In the photovoltaic device according to the first embodiment of the present invention, a continuous second silver layer 2b having a substantially uniform thickness is deposited on a semi-continuous first silver layer 2a having an uneven surface to maintain satisfactory the scatterreflection (TR−R)/TR and increasing the total reflection TR as shown in FIG. 5B.

The following Table 1 indicates the comparison of various photoelectric conversion characteristics between a photovoltaic device A according to the first embodiment of the present invention and a photovoltaic device B according to the prior art. The photovoltaic device A includes a semi-continuous first silver layer 2a deposited to a thickness of 500Å at 350° C. on a stainless steel substrate 1, a continuous second silver layer 2b deposited to a substantially uniform thickness of 500Å at 150° C. on the first silver layer 2a, and an amorphous SiGe film 3 deposited on the second silver layer 2b. The amorphous SiGe includes a p-i-n junction, where the thickness of the i layer is approximately 2500Å. The photovoltaic device B according to the prior art includes a continuous single silver layer deposited on a stainless steel substrate to a thickness of 1000Å at 350° C., and an amorphous SiGe film deposited on the single silver layer.

TABLE 1

| Photo Voltaic Device | Short-Circuit Current $I_{SC}$ | Open Circuit Voltage $V_{OC}$ | Fill Factor FF | Conversion Efficiency $\eta$ |
| --- | --- | --- | --- | --- |
| A | 1.15 | 0.99 | 1.04 | 1.18 |
| B | 1.00 | 1.00 | 1.00 | 1.00 |

It is appreciated from Table 1 that the photovoltaic device A of the first embodiment is superior to the photovoltaic device B of the prior art in all photoelectric conversion characteristics of short-circuit current $I_{SC}$, fill factor FF, and conversion efficiency $\eta$, the excluding open-circuit voltage $V_{OC}$. Particularly, the conversion efficiency $\eta$ is improved by 18%.

Although the first and the second silver layers 2a and 2b are directly formed on the polished surface of the stainless steel substrate 1 in the above first embodiment, the silver reflecting layers 2a and 2b may be provided on a titanium layer formed on the substrate 1 by electron beam evaporation or sputtering. This is because such a titanium layer improves adhesiveness between the stainless steel substrate 1 and the silver reflecting layers 2a and 2b.

Although the SiGe semiconductor film 3 is formed directly on the continuous second silver layer 2b in the above mentioned first embodiment, a transparent ZnO conductive layer may be provided between the reflecting layer 2b and the semiconductor film 3. The ZnO layer serves to improve the light confinement effect within the semiconductor film 3 due to its reflective index effect. The preferred thickness of the ZnO layer is 500-2500Å. A uniform film of the ZnO layer cannot be obtained if it is too thin. On the contrary, the photoelectric conversion efficiency does not increase even if the ZnO layer is made thicker than 2500Å. A more preferable thickness of the ZnO layer is within the range of 700-1500Å.

Figure 8:
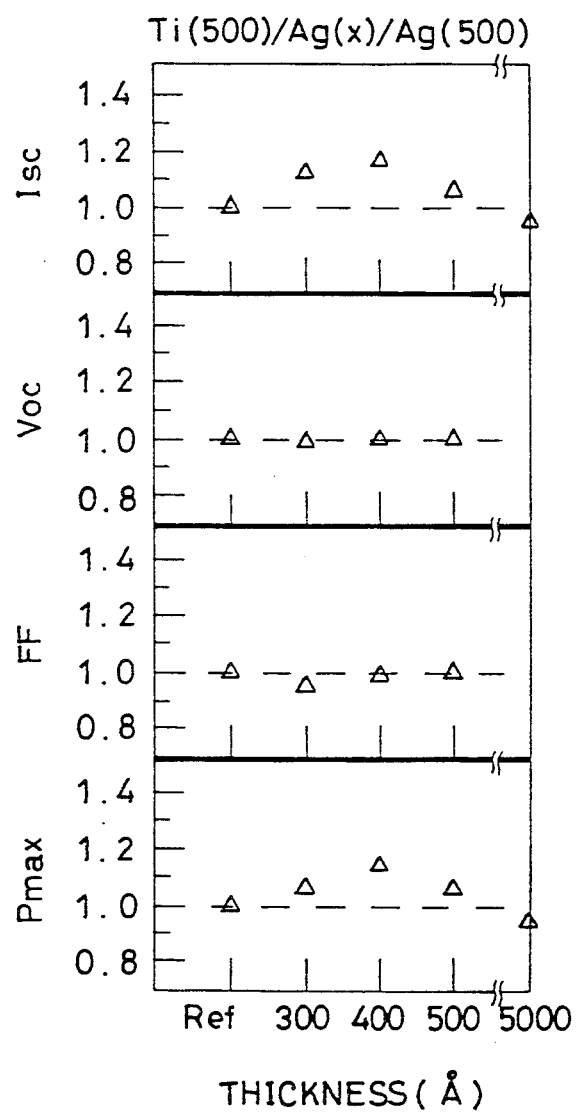
FIG. 8 is a graph showing the influence of the thickness of the first silver layer of the first embodiment upon photoelectric conversion characteristics.

FIG. 8 indicates the influence of the thickness of the first silver layer 2a upon the various photoelectric conversion characteristics. In the graph, the abscissa indicates the thickness (Å) of the first silver layer, and the ordinate indicates the photoelectric conversion characteristics such as short-circuit current $I_{SC}$, open circuit voltage $V_{OC}$, fill factor FF, and maximum output $P_{max}$. The photovoltaic device of FIG. 8 includes a titanium layer deposited to a thickness of 500Å at a growth rate of approximately 30Å/second on the stainless steel substrate at 350° C., a first silver layer formed on the titanium layer at 350° C. with the thicknesses represented by the abscissa, and a second silver layer formed to the thickness of 500Å at 150° C. The Ref point on the abscissa indicates a photovoltaic device of the prior art, which includes a titanium layer of 500Å thickness formed on a stainless steel substrate, and a single silver layer of 1000Å thickness formed above the titanium layer at 350° C. The photoelectric conversion characteristics on the abscissa are normalized by the characteristics of the photovoltaic device of the prior art. It can be appreciated from the graph of FIG. 8 that the preferred thickness of the first silver layer is within the range of approximately 250-600Å.

Figure 9:
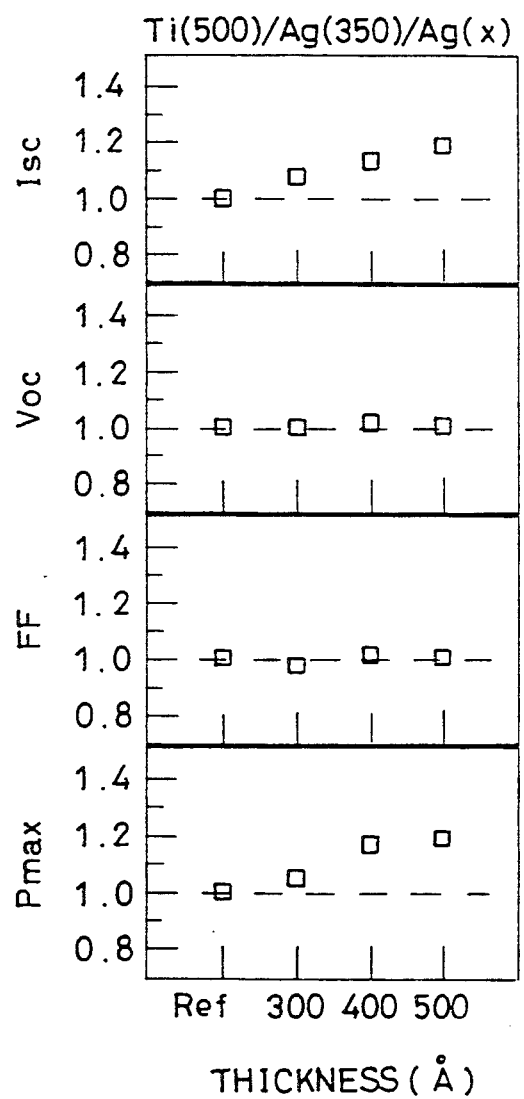
FIG. 9 is a graph showing the influence of the thickness of the second silver layer of the first embodiment upon photoelectric conversion characteristics.

FIG. 9 is similar to FIG. 8, except that the abscissa in FIG. 9 indicates the thicknesses of the second silver layer, and the thickness of the first silver layer is set to a predetermined thickness of 350Å. It can be appreciated from FIG. 9 that the preferred thickness of the second silver layer is more than 300Å. A more preferred thickness of the second silver layer is within the range of 350-500Å, because the photoelectric conversion characteristics are not improved even if the thickness of the second silver layer is more than 500Å.

Figure 10:
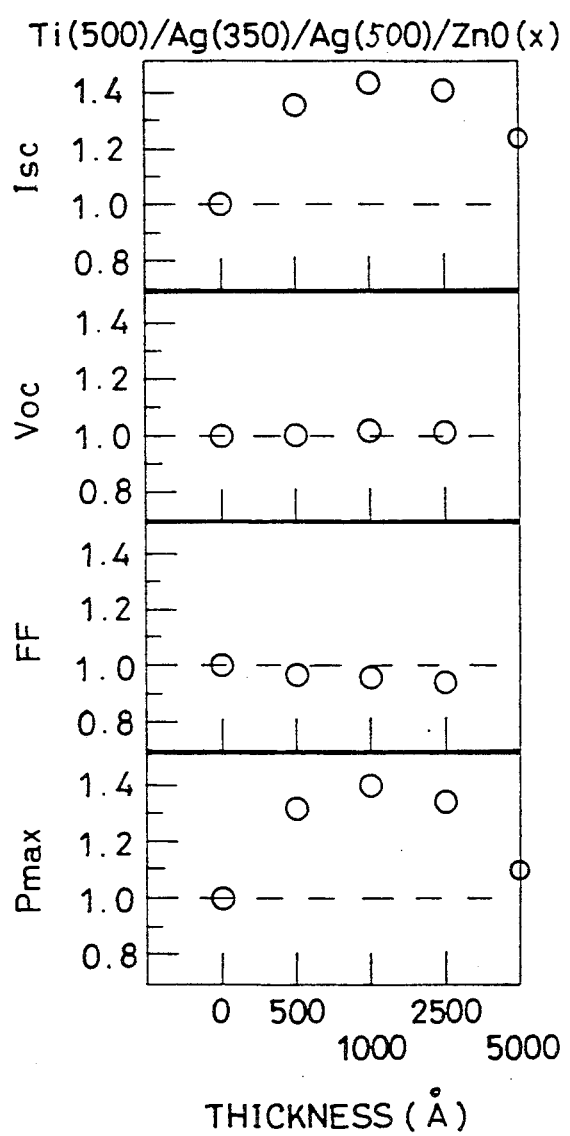
FIG. 10 is a graph showing the influence of the thickness of the ZnO layer of the first embodiment upon photoelectric conversion characteristics.

The photovoltaic device shown in the graph of FIG. 10 includes a first silver layer having a thickness of 350Å, a second silver layer having a thickness of 500Å and an ZnO layer deposited on the second silver layer. The abscissa of FIG. 10 indicates the thickness (Å) of the ZnO layer. The various photoelectric conversion characteristics of the ordinate are normalized by the characteristic of a photovoltaic device not including a ZnO layer. It is appreciated from this graph that the preferred thickness of the ZnO layer is within the range of 500-2500Å, and more preferably within the range of 700-1500Å.

Figure 11:
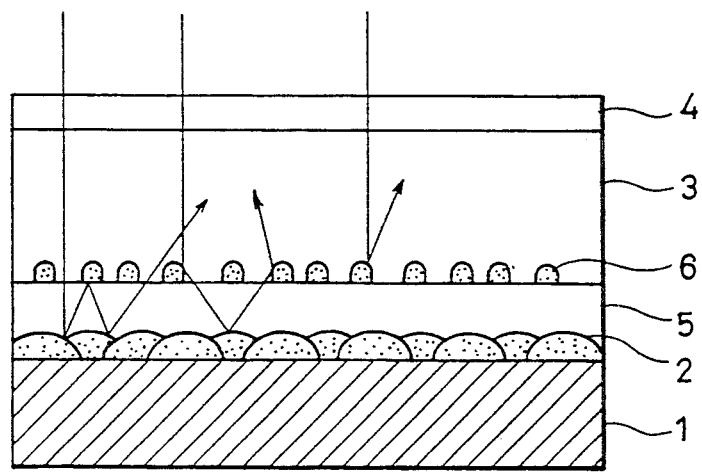
FIG. 11 is a sectional view schematically showing a photovoltaic device according to a second embodiment of the present invention.

Referring to FIG. 11, a sectional view of a photovoltaic device according to a second embodiment of the present invention is shown. In this photovoltaic device, a continuous reflective first metal layer 2 is formed to completely cover the surface of the substrate 1. The first metal layer 2 is covered by a transparent conductive layer 5. An island-like reflective second metal layer 6 is formed on transparent conductive layer 5. It is preferred that this island-like second metal layer covers 30-70% of the surface of the transparent conductive layer 5. The first metal layer 2, the transparent conductive layer 5 and the second metal layer 6 serve as a back electrode. An amorphous semiconductor film 3 for photoelectric conversion is formed to cover the island-like porous second metal layer 6 and the transparent conductive layer 5. A transparent front electrode 4 is formed on the amorphous semiconductor film 3.

Incident light into the photovoltaic device of FIG. 11 passes through the semiconductor film 3, where a portion is scatter-reflected by the island-like second metal layer 6. Light passing between the islands of the second metal layer 6 or light entering the transparent conductive layer 5 having their directions changed by the islands are reflected by the continuous first metal layer 2, and passes again between the islands of the second metal layer 6 or have their direction change by these islands to be returned to the semiconductor film 3. Incident light into the photovoltaic device has a tendency to be confined within the semiconductor film 3 to improve the photoelectric conversion efficiency.

Figure 12:
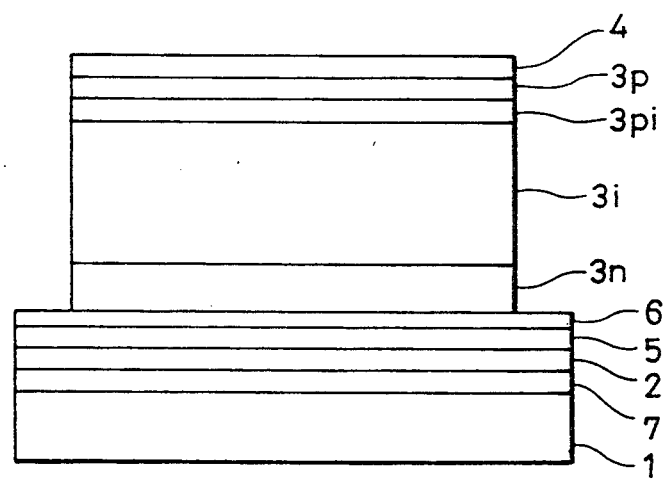
FIG. 12 is a sectional view showing an example of a photovoltaic device of the second embodiment in detail.

Referring to FIG. 12, a sectional view of an example of a photovoltaic device according to the second embodiment is shown in detail. A titanium layer 7 is formed to a thickness of approximately 500Å by electron beam evaporation on a stainless steel substrate 1. A continuous first silver layer 2 is deposited to a thickness of 1000Å by evaporation at 350° C. on the titanium layer 7. A transparent ZnO conductive layer 5 is formed to a thickness of 1000Å on the first silver layer 2. An island-like second silver layer 6 is deposited to a thickness of 200Å by evaporation on the ZnO conductive layer 5. The island-like second silver layer 6 covers approximately 50% of the surface of the transparent conductive layer 5.

Then, an n-type amorphous Si layer 3n, an i-type amorphous Si layer 3i, a p-i interface layer 3pi of amorphous SiC, and a p-type amorphous SiC layer 3p are subsequently deposited by plasma CVD method to cover island-like second silver layer 6 and ZnO conductive layer 5. Lastly, a transparent front electrode 4 is formed on the p-type amorphous SiC layer 3p.

Figure 13:
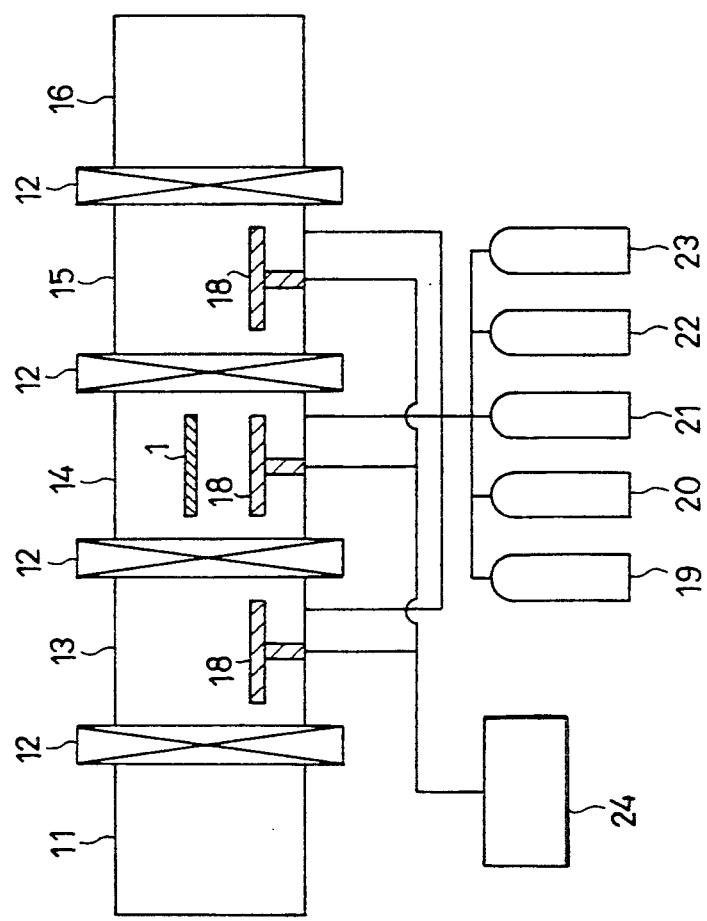
FIG. 13 is a diagram schematically showing a plasma CVD device for depositing an amorphous semiconductor layer.

Referring to FIG. 13, a plasma CVD device for depositing the amorphous semiconductor layer is schematically shown. This plasma CVD device includes an introducing chamber 11, a gate valve 12, a reaction chamber 13 for forming n-type semiconductor layer, a reaction chamber 14 for forming i-type semiconductor layer, a reaction chamber 15 for forming p-type semiconductor layer, and a removing chamber 16. A cathode 18 is provided within each of reaction chambers 13-15. Bombs 19-23 contain $SiH_4$, $H_2$, $CH_4$, $PH_3$ and $B_2H_6$, respectively. The plasma CVD device further includes a high frequency power source 24 to deposit a semiconductor layer the substrate 1. Each amorphous semiconductor layers of 3n, 3i, 3pi, and 3p in the photovoltaic device of FIG. 12 can be formed using the CVD device of FIG. 13 based on gas flow of Table 2.

TABLE 2

| | | | | | unit (sccm) |
|---|---|---|---|---|---|
| Semiconductor Layer | $SiH_4$ | $H_2$ | $CH_4$ | $B_2H_6$ | $PH_3$ |
| p Layer | 20 | 50 | 25 | 0.02 | |
| pi Interface Layer | 80 | 30 | 1-80 | | |
| i Layer | 60 | 20 | | | |
| n Layer | 7 | 80 | | | 0.3 |

The photovoltaic device of FIG. 12 indicates an improvement of approximately 10% in short circuit current in comparison with a photovoltaic device of the prior art. The photovoltaic device for comparison is similar to that of FIG. 12, except that the transparent conductive layer 5 and the island-like second silver layer 6 are not provided.

If the continuous first silver layer 2 is formed with the semi-continuous silver layer 2a and the continuous silver layer 2b of FIG. 1 in the above described second embodiment, the short-circuit current will be further improved.

Figure 14:
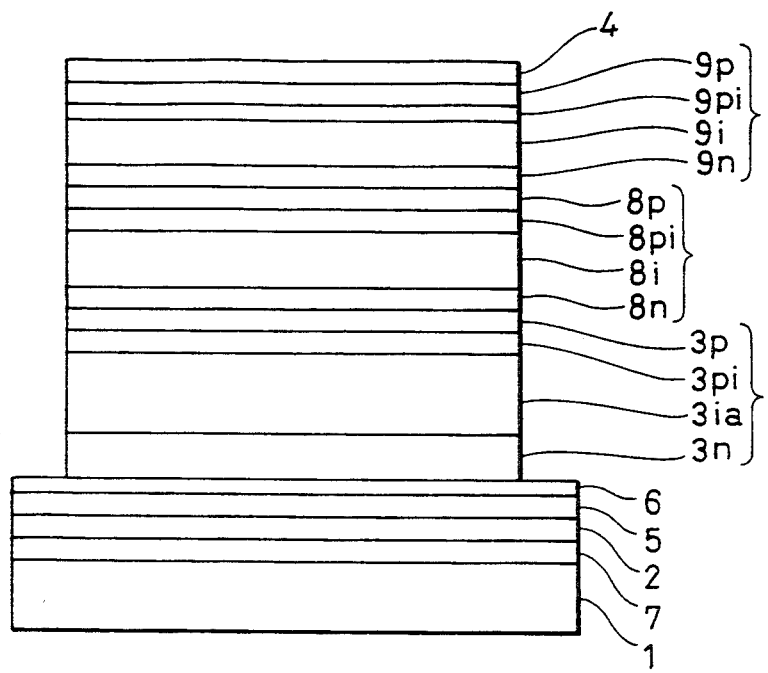
FIG. 14 is a sectional view schematically showing a tandem type photovoltaic device according to a third embodiment of the present invention.
Figure 15:
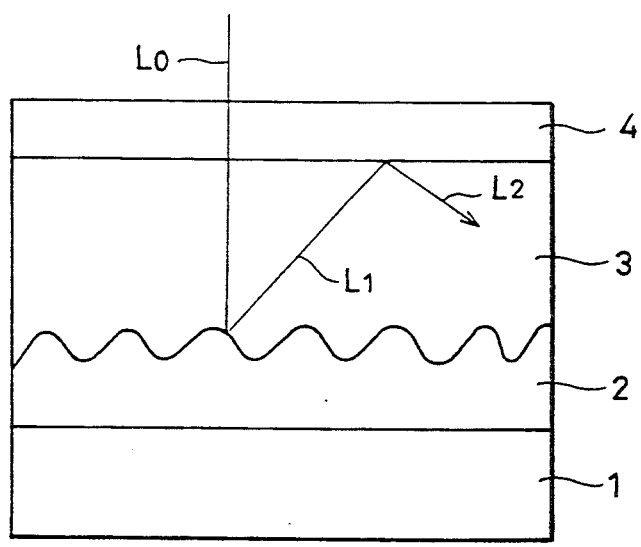
FIG. 15 is a diagram for explaining "light confinement" within a semiconductor film of a photovoltaic device.

FIG. 14 shows a sectional view of a tandem type photovoltaic device including a three layered photovoltaic cell according to a third embodiment of the present invention. Because the absorption coefficient of light having a long wavelength in a semiconductor film is normally small, a tandem type photovoltaic device is preferred for efficiently utilizing light having a long wavelength. It is also preferred to use an i layer of amorphous SiGe with an energy band gap smaller than 1.75eV, which is the energy band gap of amorphous silicon, to efficiently utilize light having a long wavelength. It is also preferred that the photovoltaic cell including an i layer of amorphous SiGe is arranged in the lower layer of the tandem type photovoltaic device. Similar to the photovoltaic device of FIG. 12, the tandem type photovoltaic device of FIG. 14 includes a titanium layer 7 of 500Å thickness, a continuous first silver layer 2 of1000Å thickness, a transparent ZnO conductive layer 5 of 1000Å thickness, and an island-like second silver layer 6 of 200Å thickness, which are deposited sequentially on the stainless steel substrate 1.

Above the island-like second silver layer 6 and the transparent conductive layer 5, an n-type amorphous Si layer 3n, an i-type amorphous SiGe layer 3ia, a p-i interface layer 3pi of amorphous SiC, and a p-type amorphous SiC layer 3p are deposited to form the first layer the photovoltaic cell.

Above the first photovoltaic cell, an n-type amorphous Si layer 8n, an i-type amorphous Si layer 8i, a p-i interface layer 8pi of amorphous SiC, and a p-type amorphous SiC layer 8p are sequentially deposited to form the second layer photovoltaic cell.

Above the second layer of photovoltaic cell, an n-type amorphous Si layer 9n, an i-type amorphous SiC layer 9i, a p-i interface layer 9pi of amorphous SiC, and a p-type amorphous SiC layer 9p are sequentially deposited to form the third layer of photovoltaic cell. Lastly, a transparent front electrode 4 is formed on the third layer photovoltaic cell.

The tandem type photovoltaic device of FIG. 14 indicated an improvement of approximately 20% in short circuit current in comparison with a tandem type photovoltaic device of the prior art. This tandem type photovoltaic device used for comparison is similar to that of FIG. 14, except that the transparent conductive layer 5 and the island-like second silver layer 6 are not provided.

If the continuous first silver layer 2 is formed with the semi-continuous silver layer 2a and the continuous silver layer 2b of FIG. 1 in the tandem type photovoltaic device of the third embodiment, the short circuit current is further improved.

Although silver is used as the reflective metal in the above embodiments, aluminum, copper, gold and the like may be used instead. Not only an amorphous semiconductor layer, but also a polycrystal semiconductor layer or a monocrystal semiconductor layer may be used as the semiconductor layer. Not only Si, SiGe, SiC, but also other various compound semiconductors may be used for the semiconductor. Furthermore, not only stainless steel, but also other various material such as glass may be used for the material of the substrate.

Hence, according to the present invention, a photovoltaic device and a method of manufacturing the same can be provided that has the photoelectric conversion efficiency improved by confining light efficiently within a semiconductor film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising:
   a substrate;
   a metal layer having a nonuniform and uneven surface formed on said substrate, said metal layer including a plurality of continuous metal layers which form a porous layer;
   a reflective continuous metal layer having a substantially uniform thickness formed to cover said porous metal layer;
   a semiconductor film for photoelectric conversion formed on said reflective continuous metal layer; and
   a transparent electrode formed on said semiconductor film.

2. The device according to claim 1, wherein
   said porous metal layer comprises a first silver layer preferably having a thickness within the range of 250–800Å, and
   said reflective continuous metal layer comprises a second silver layer preferably having a thickness within the range of 300–700Å.

3. The device according to claim 2, wherein
   said first silver layer comprises more preferably a thickness within the range of 250–600Å, and
   said second silver layer comprises more preferably a thickness within the range of 350–500Å.

4. The device according to claim 2, wherein
   said substrate comprises a stainless steel substrate, and further comprising
   a titanium layer inserted between said stainless steel substrate and said first and second silver layers.

5. The device according to claim 1, wherein a ZnO layer is inserted between said reflective continuous metal layer and said semiconductor film.

6. The device according to claim 5, wherein said ZnO layer comprises preferably a thickness within the range of 500–2500Å.

7. A photovoltaic device comprising:
   a substrate;
   a continuous metal layer having a reflecting surface formed on said substrate;
   a transparent conductive layer formed to cover said continuous metal layer;
   a reflective metal layer formed on said transparent conductive layer having a nonuniform and uneven surface formed on said substrate, said reflective metal layer including a plurality of continuous metal layers which form a porous layer;
   a semiconductor film for photoelectric conversion formed to cover said reflective metal layer and said transparent conductive layer; and
   a transparent electrode formed on said semiconductor film.

8. The device according to claim 7, wherein said continuous metal layer comprises silver, and said reflective metal layer comprises silver.

9. The device according to claim 7, wherein said continuous silver layer comprises an uneven surface.

10. The device according to claim 9, wherein said continuous silver layer comprises

- a sub-layer having a nonuniform and uneven surface, said sub-layer including a plurality of continuous sub-layers which form a semicontinuous sub-layer; and
- a continuous sub-layer having a substantially uniform thickness formed to cover said semi-continuous sub-layer.

11. The device according to claim 7, wherein said reflective metal layer covers 30-70% of the surface of said transparent conductive layer.

12. The device according to claim 7, wherein said semiconductor film comprises an n-type semiconductor layer, an i-type semiconductor layer, a p-i semiconductor interface layer and a p-type semiconductor layer to form a p-i-n structure.

13. The device according to claim 6, wherein said ZnO layer comprises more preferably a thickness within the range of 700-1500Å.

14. The device according to claim 1, wherein said plurality of continuous metal layers which form said porous layer comprise a peninsula-like pattern.

15. The device according to claim 7, wherein said plurality of reflective metal layers which form said porous layer comprise an island-like pattern.

* * * * *